United States Patent [19]

Belouet

[11] Patent Number: 4,695,480
[45] Date of Patent: Sep. 22, 1987

[54] METHOD AND APPARATUS FOR DRAWING A TAPE CONSTITUTED BY A SUPPORT COATED IN A LAYER OF SEMICONDUCTOR MATERIAL, SAID TAPE BEING DRAWN FROM A LIQUID BATH OF SAID MATERIAL

[75] Inventor: Christian Belouet, Sceaux, France

[73] Assignees: Compagnie Generale d'Electricite, Cedex; Societe Nationale Elf Aquitaine, Courbevoie, both of France

[21] Appl. No.: 843,546

[22] Filed: Mar. 25, 1986

[30] Foreign Application Priority Data

Mar. 25, 1985 [FR] France ................................ 85 04407

[51] Int. Cl.$^4$ ............................................. B05D 5/12
[52] U.S. Cl. ................................. 437/225; 427/434.3;
427/431; 427/430.1; 427/434.5; 427/433
[58] Field of Search ....................... 427/86, 434.3, 431,
427/430.1, 434.5, 88, 433; 118/503

[56] References Cited

U.S. PATENT DOCUMENTS

| | | | |
|---|---|---|---|
| 3,639,142 | 2/1972 | Maxwell | 118/503 |
| 4,520,752 | 6/1985 | Belouet | 118/405 |
| 4,554,203 | 11/1985 | Grabmaier | 427/86 |

FOREIGN PATENT DOCUMENTS

| | | | |
|---|---|---|---|
| 2386359 | 11/1978 | France | 118/405 |
| 2550965 | 3/1985 | France | 118/405 |

Primary Examiner—John D. Smith
Assistant Examiner—Vi D. Dang
Attorney, Agent, or Firm—Sughrue, Mion, Zinn, Macpeak & Seas

[57] ABSTRACT

The method consists in clamping the edges of the tape between two jaws of a clamp and in displacing the clamp vertically upwardly. The apparatus includes two vertical columns (10, 11) along which two carriages (12, 13) are capable of moving, with each carriage having a corresponding clamp (14, 15) and means (16, 17, 19, 20) for controlling clamp operation and vertical displacement of the carriages along the columns. Such semiconductor-coated material is suitable for making solar photocells, for example.

2 Claims, 2 Drawing Figures

METHOD AND APPARATUS FOR DRAWING A TAPE CONSTITUTED BY A SUPPORT COATED IN A LAYER OF SEMICONDUCTOR MATERIAL, SAID TAPE BEING DRAWN FROM A LIQUID BATH OF SAID MATERIAL

The present invention relates to a method and to apparatus for drawing a tape constituted by a support coated in a layer of semiconductor material, said tape beind drawn from a liquid bath of said material.

BACKGROUND OF THE INVENTION

A method and an apparatus of this type are illustrated in French published patent application 2 386 359. In FIG. 2 of this document, a carbon tape 4 passes through a silicon bath 2 after passing through a slot 7 provided in the bottom of a receptacle 1 containing the bath. The tape 4 is tensed and is continuously drawn vertically by friction between two rolls. The two rolls 5 are situated above the bath and may, for example, be rotated about their axes in opposite directions to each other.

The drawing method illustrated by this document suffers from drawbacks. The pressure exerted by the rolls on the tape may cause fractures in the layer of deposited silicon. Further, it is difficult to prevent a tape being drawn in this manner from moving in its own plane from side to side about the drawing axis, thereby tearing the tape on the edges of the slot.

Preferred embodiments of the present invention mitigate these drawbacks.

SUMMARY OF THE INVENTION

The present invention provides a method of drawing a tape consituted by a support coated with a layer of semiconductor material, said tape being drawn from a liquid bath of said mateial, the tape being tensed in a vertical plane, said method comprising:

clamping two opposite portions of two respective edges of the tape between the two jaws of a clamp, the clamping being performed at a first level above the bath, in such a manner as to hold the tape coated with said layer in a vertical plane; and while clamping the tape, vertically displacing the clamp from the first level to a second level higher than the first level, said displacement taking place at a predetermined constant speed, and the distance between said first and second levels being large relative to the length of said portions.

Advantageously, said clamp is a first clamp, and said method further comprises:

clamping two opposite portions of the two respective edges of the tape between the two jaws of a second clamp analogous to the first clamp, said clamping being formed at the first level shortly before the end of displacement of the first clamp;

vertically displacing the second clamp while clamping the tape as soon as said second clamp is clamped thereto, said displacement taking place from the first level to the second level at a speed equal to said predetermined constant speed;

opening the jaws of the first clamp when it reaches the second level, thereby releasing the tape; and immediately after opening the jaws, vertically displacing the first clamp from the second level to the first level, said displacement taking place at a higher speed than said predetermined constant speed, thereby enabling said first clamp to be ready to take hold of the tape at the first level before said second clamp has reached the second level.

The present invention also provides apparatus for drawing a tape constituted by a support coated with a layer of semiconductor material, said tape being drawn from a liquid bath of said material, the tape being tensed in a vertical plane, said apparatus comprising:

two vertical columns disposed on either side of the plane faces of the tape;

a carriage fixed to each column in such a manner as to be capable of being displaced along the column;

a clamp fixed to each carriage, said clamp comprising two hinged jaws for taking hold of the tape by the edges thereof, said jaws being provided with grooves in which the edges of the tape are received;

means for controlling the opening and closing of the jaws of said clamps; and means for controlling the displacement of the carriages above the bath and along the columns.

BRIEF DESCRIPTION OF THE DRAWINGS

A particular implementation of the present invention is described below, by way of example, with reference to the accompanying drawings, in which.

MORE DETAILED DESCRIPTION

Figure 1:
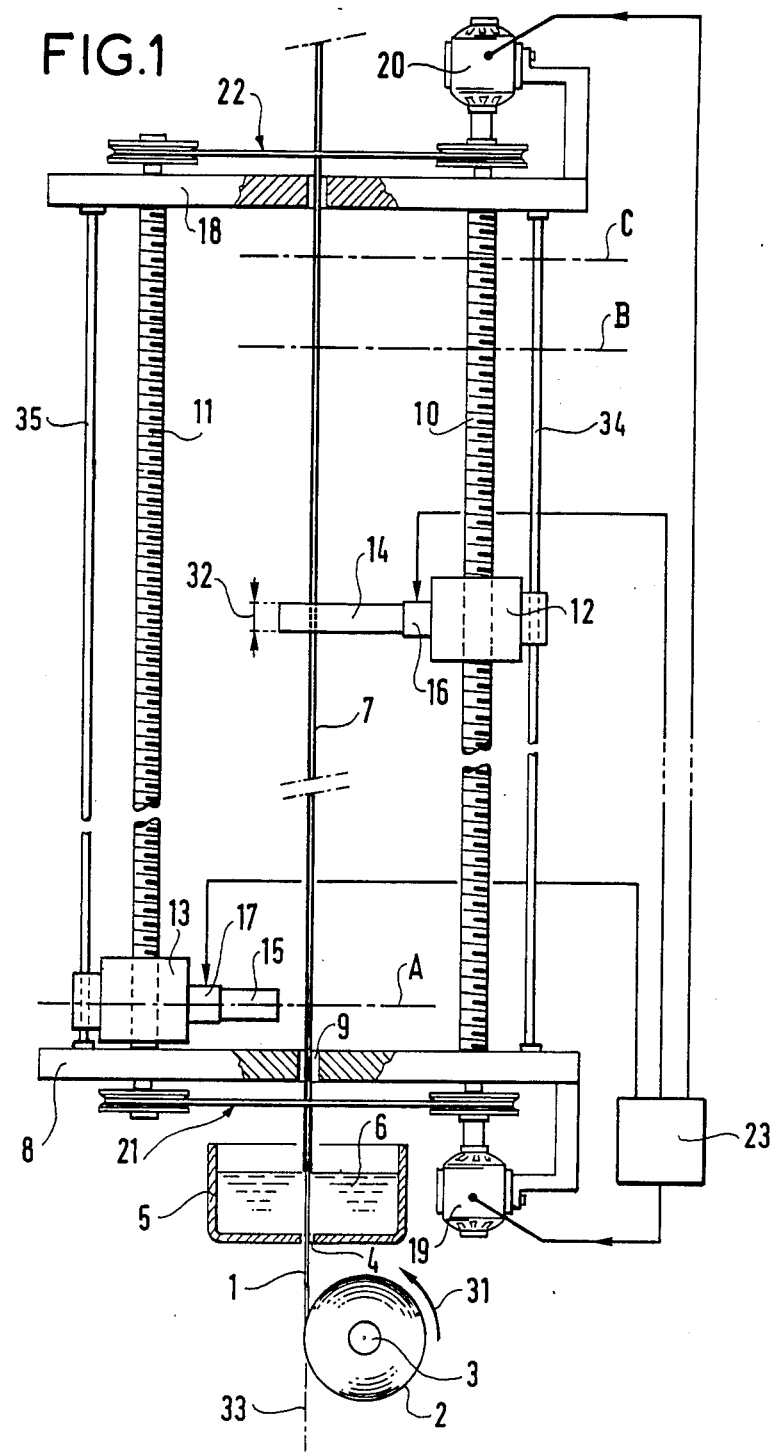
FIG. 1 is a diagrammatic view of one embodiment of an apparatus in accordance with the invention.

FIG. 1 shows a carbon tape 1 being unwound from a drum 2 which is rotatably mounted about an axis 3 perpendicular to the plane of FIG. 1. The tape 1 is disposed in a vertical plane 33 extending perpendicularly to the plane of the figure, and passes through a slot 4 provided in the bottom of a quartz receptacle 5 containing a bath 6 of molten silicon. The dimensions of the slot 4 are chosen so that the meniscus connecting the liquid silicon to the edges of the slot is stable. The coated tape 7 leaving the bath 6 is covered with a layer of polycrystalline silicon. A horizontal metal plate 8 having an opening 9 through which the coated tape 7 passes is disposed above the receptacle 5. Two vertical threaded rods 10 and 11 are fixed on the plate 8 on either side of the two plane faces of the plate 7 and are mounted to be rotatable about their axes. Each of these rods has a carriage fixed thereto including an element which meshes with the thread of the rod in such a manner as to enable the carriage to move along the rod when the rod is rotated about its axis. A smooth cylindrical retaining column 34, 35 is associated with each rod in order to guide the carriage during its displacement. FIG. 1 shows one carriage 12 situated substantially in the middle of the rod 10, and another carriage 13 situated at the bottom of the rod 11.

Each carriage has clamp fixed thereto which is capable of taking hold of the coated tape 7. Each clamp comprises two jaws hinged to a support and movable in a horizontal plane. Thus, the clamp 14 fixed on the carriage 12 is shown as being clamped to the tape 7, while the clamp 15 fixed to the carriage 13 is shown as being open. Respective electromechanical systems 16 and 17 are associated with the clamps 14 and 15 in order to open and close their jaws.

Another horizontal metal plate 18 is disposed at the top of the apparatus for holding the top ends of the rods 10 and 11. Two electric motors 19 and 20 are fixed to the plates 8 and 18 respectively in order to rotate the rods 10 and 11 in opposite directions and at different speeds. Belts and pulley coupling systems 21 and 22 are provided for simultaneously driving both threaded rods 10 and 11. The apparatus further includes clutches (not shown) for enabling the threaded rods to be decoupled from the shafts of the motors 19 and 20. Finally, an electrical control circuit 23 is connected to the motors 19 and 20 and also to the electromechanical systems 16 and 17.

Figure 2:
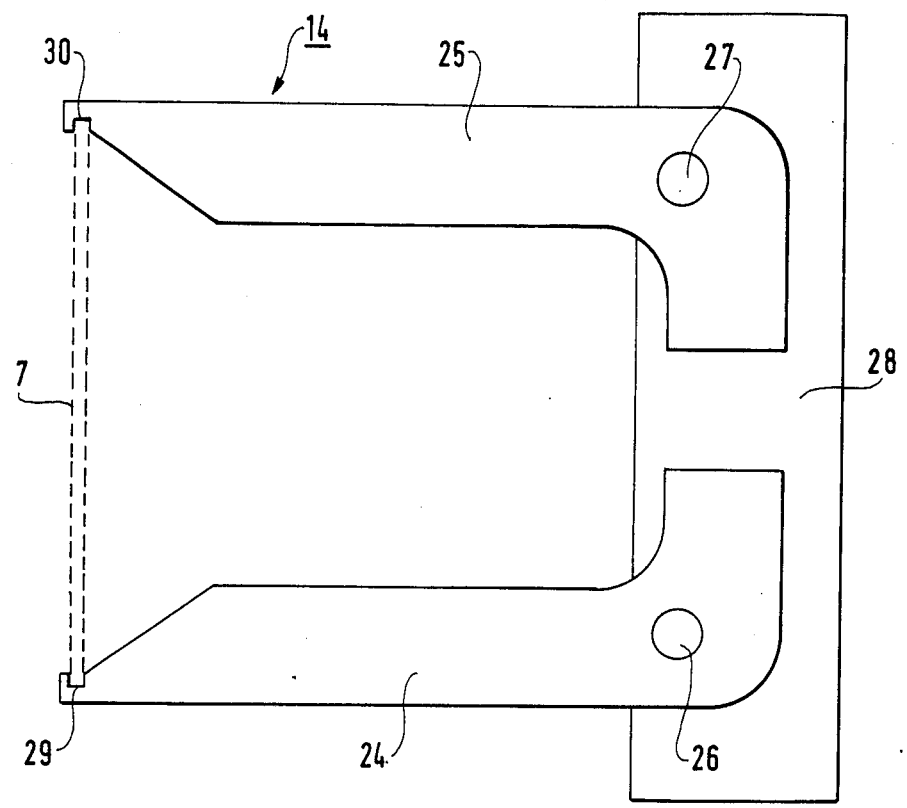
FIG. 2 is a plan view on a larger scale of the clamp of the apparatus shown in FIG. 1.

FIG. 2 shows how the clamps of the apparatus shown in FIG. 1 may be embodied. The clamp 14 is shown in its closed position and comprises two jaws 24 and 25 roatatably mounted about respective parallel axes 26 and 27. These axes are fixed perpendicularly to a support 28 which is maintained in a horizontal plane, said support being mounted on the carriage 12 (see FIG. 1). The free ends of the two jaws 24 and 25 are provided with respective vertical grooves 29 and 30 in which the edges of the tape 7 may be received, with the cross-section of the tape being shown in dashed lines in FIG. 2.

The apparatus descibed above and shown in FIGS. 1 and 2 operates as follows.

While the carriage 13 remains stationary at its lowest level A in contact with the plate 8, the jaws 15 remain open and the motor 20 is switched on by means of the circuit 23 in order to bring the carriage 12 down to level A. The system 16 is then caused to close the jaws of the clamp 14 and the tape 7 is guided by hand to ensure that two opposite portions of its edges are received in the grooves 29 and 30 of the jaws 24 and 25.

The drum 2 has a spiral spring or brake system capable of permanently exerting a couple on the tape about the axis 3 in the direction of arrow 31 in such a manner as to tense the tape 1–7 in a vertical plane 33 passing through the axis of the slot 4. By way of example, the tape may be 5 cm wide and may be constituted by a carbon support having a thickness lying in the range 200 to 300 micrometers, said support being covered on both faces by a layer of silicon which is 100 micrometers thick, the length 32 of said edge portions of the tape being one centimeter, and the vertical tension applied to the tape being less than 500 grams.

The motor 19 is then switched on to displace the carriage 12 continuously vertically upwardly along the rod 10 at a predetermined speed which corresponds to the drawing speed. The clamping force applied by the clamp 14 is adjusted to a value which is high enough (taking account of the length 32 of said edge portions) to prevent the tape from slipping relative to the clamp while it is being displaced. However, this clamping force must not be too high in order to avoid damaging the edges of the tape and in order to avoid any curving of the tape which must be kept in a vertical plane over its entire area.

When vertical displacement of the carriage 12 has moved it past the position shown in FIG. 1 so that it arrives at a level B slightly below the maximum level C, the circuit 23 causes the clamps 15 to close on the edges of the ribbon 17, and simultaneously the rod 11 is rotated by the motor 19 via the coupling system 21. The carriage 13 supporting the clamp 15 now clamped to the tape 7 thus moves upwardly at the same speed as the carriage 12. When the carriage 12 reaches the top level C, the circuit 23 and the system 17 open the clamp 14 so as to releasee the tape 7. Simultaneously, the motor 19 is decoupled from the rod 10 and the down motor 20 is coupled to the rod 10.

The carriage 12 moves back down towards the plate 8 at a speed which is much higher than the speed at which it moved up, and meanwhile the tape 7 continues to be drawn upwardly by the clamps 15. When the carriage 12 arrives at level A, its open clamp 14 is ready to take hold of the tape, and this is done when the carriage 13 arrives at level B.

Naturally, the tape 7 may be cut across above the plate 18 by conventional means (not shown) in order to obtain silicon-coated sheets of convenient length. These sheets may be used for making silicon solar cells.

The method and apparatus described above are capable of drawing carbon tape coated with a layer of polycrystalline silicon from a bath of molten silicon and along a very accurate drawing axis without the edges of the tape moving sideways in the drawing plane. The method considerably reduces the probability of fractures forming in the layer of silicon. Such fractures can only occur in the portions of the tape edges which are clamped in the clamps. These fractures thus only concern the edges of the tape and occur in well delimited and short zones. The length 32 of the portions of ribbon edge clamped in the clamps is always very short relative to the distance between the bottom level A and the top level C, with the level B being very close to the top level C. For example, the length 32 may be about one centimeter, with the difference between levels C and A being about 50 centimeters. In addition, it should be observed that the thickness of the deposited layer of silicon may be of increased on the edges of the tape, thereby increasing the crushing strength of the layer at this point. Finally, the clamping action of the clamps acts on the tape in a transverse direction in which it has particularly high bending strength, thereby avoiding any possibility of the tape being curved when the clamps take hold of it.

The method and the apparatus in accordance with the invention are applicable not only to drawing a carbon tape coated with a layer of silicon from a bath of molten silicon for the purpose of making solar photocells, but also to drawing tapes constituted by a support made of a material other than carbon, which support may be covered with a layer of a semiconductor material other than silicon. For example, the support may be constituted by a material such as very high melting point tungsten, and the semiconductor material constituting the layer may be germanium, gallium arsenide, or cadmium telluride. The liquid bath semiconductor material may be constituted not only by a molten material, but also by a liquid solution of said material.

It is claimed:

1. A method of drawing a tape constituted by a support coated with a layer of semiconductor material, said tape being drawn from a liquid bath of said material, the tape being tensed in a vertical plane, said method comprising:

clamping two opposite portions of two respective edges of the tape between the two jaws of a clamp, the clamping being performed at a first level above the bath, in such a manner as to hold the tape coated with said layer in a vertical plane; and while clamping the tape, vertically displacing the clamp from the first level to a second level higher than the first level, said displacement taking place at a predetermined constant speed, and the distance between said first and second levels being large relative to the length of said portions.

2. A method according to claim 1, wherein said clamp is a first clamp, and wherein said method further comprises:

clamping two opposite portions of the two respective edges of the tape between the two jaws of a second clamp analogous to the first clamp, said clamping being formed at the first level shortly before the end of displacement of the first clamp;

vertically displacing the second clamp while clamping the tape as soon as said second clamp is clamped thereto, said displacement taking place from the first level to the second level at a speed equal to said predetermined constant speed;

opening the jaws of the first clamp when it reaches the second level, thereby releasing the tape; and immediately after opening the jaws, vertically displacing the first clamp from the second level to the first level, said displacement taking place at a higher speed than said predetermined constant speed, thereby enabling said first clamp to be ready to take hold of the tape at the first level before said second clamp has reached the second level.

* * * * *